(12) United States Patent
Sinha

(10) Patent No.: US 6,969,301 B2
(45) Date of Patent: Nov. 29, 2005

(54) FILLING PLUGS THROUGH CHEMICAL MECHANICAL POLISH

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/866,281

(22) Filed: Jun. 11, 2004

(65) Prior Publication Data

US 2004/0221450 A1 Nov. 11, 2004

Related U.S. Application Data

(63) Continuation of application No. 09/943,582, filed on Aug. 30, 2001, now Pat. No. 6,757,971.

(51) Int. Cl.7 ............................................. B24B 1/00
(52) U.S. Cl. .................. 451/36; 451/41; 451/286; 451/287; 451/288; 438/632; 438/633; 438/646; 438/650; 438/687
(58) Field of Search ......................... 451/36, 41, 286, 451/287, 288; 438/632, 633, 646, 650, 687

(56) References Cited

U.S. PATENT DOCUMENTS

| | | | |
|---|---|---|---|
| 4,502,210 A | * | 3/1985 | Okumura et al. ........... 438/629 |
| 5,308,792 A | | 5/1994 | Okabayashi et al. |
| 5,439,551 A | | 8/1995 | Meikle et al. |
| 5,547,902 A | | 8/1996 | Rohner |
| 5,610,103 A | | 3/1997 | Xu et al. |
| 5,654,232 A | | 8/1997 | Gardner |
| 5,668,055 A | | 9/1997 | Xu et al. |
| 5,795,495 A | | 8/1998 | Meikle |
| 5,863,307 A | | 1/1999 | Zhou et al. |
| 5,914,851 A | | 6/1999 | Saenger et al. |
| 5,916,819 A | | 6/1999 | Skrovan et al. |
| 5,958,288 A | | 9/1999 | Mueller et al. |
| 5,972,540 A | | 10/1999 | Lee |
| 5,976,970 A | | 11/1999 | Dalal et al. |
| 5,985,045 A | | 11/1999 | Kobayashi |
| 6,060,386 A | | 5/2000 | Givens |
| 6,100,194 A | | 8/2000 | Chan et al. |
| 6,136,218 A | | 10/2000 | Skrovan et al. |
| 6,162,365 A | | 12/2000 | Bhatt et al. |
| 6,171,436 B1 | | 1/2001 | Huynh et al. |
| 6,194,317 B1 | | 2/2001 | Kaisaki et al. |
| 6,214,098 B1 | | 4/2001 | Lee |
| 6,234,877 B1 | | 5/2001 | Koos et al. |
| 6,245,655 B1 | | 6/2001 | Moslehi |
| 6,245,663 B1 | | 6/2001 | Zhao et al. |
| 6,306,756 B1 | * | 10/2001 | Hasunuma et al. ......... 438/632 |

(Continued)

OTHER PUBLICATIONS

M. Hauder et al.; Chemical Mechanical Polishing of Silver Damascene Structures; Microelectronic Engineering, 64 (2002) 73-79.

*Primary Examiner*—Joseph J. Hail, III
*Assistant Examiner*—Shantese McDonald
(74) *Attorney, Agent, or Firm*—Dinsmore & Shohl LLP

(57) ABSTRACT

A scheme for filling plugs through chemical mechanical polishing comprises depositing a malleable conductive layer over a dielectric layer having openings formed therein. The malleable conductive layer is deposited such that a liner is formed within the openings, however the openings are not completely filled. A chemical mechanical polishing process using an alumina based slurry at a neutral or slightly basic pH and no oxidizer is used to smear the malleable conductive layer sufficiently to fill the remainder of the openings in the dielectric layer forming filled or substantially filled plugs.

16 Claims, 7 Drawing Sheets

U.S. PATENT DOCUMENTS

| | | |
|---|---|---|
| 6,306,761 B1 | 10/2001 | Taguchi |
| 6,487,106 B1 | 11/2002 | Kozicki |
| 6,537,903 B2 | 3/2003 | Givens |
| 6,593,227 B1 | 7/2003 | Ryskoski |
| 6,712,985 B2 | 3/2004 | Biskeborn |
| 6,757,971 B2 | 7/2004 | Sinha |

\* cited by examiner

FILLING PLUGS THROUGH CHEMICAL MECHANICAL POLISH

CROSS-REFERENCE TO RELATED APPLICATIONS

This application is a continuation of U.S. patent application Ser. No. 09/943,582, filed Aug. 30, 2001 now U.S. Pat. No. 6,757,971 (MIO 0081 PA/01-0129). This application is also related to U.S. patent application Ser. No. 10/757228, filed Jan. 14, 2004 (MIO 0081 VA/01-0129.01), which is a division of U.S. patent application Ser. No. 09/943,582, filed Aug. 30, 2001 (MIO 0081 PA/01-0129).

BACKGROUND OF THE INVENTION

The present invention relates generally to the formation of integrated circuit devices and structures, and more specifically to a technique for filling plugs through chemical mechanical polishing.

Silver and other malleable metals including gold, platinum, and copper are considered important materials for manufacturing a variety of integrated circuits such as memory devices. For example, aluminum is a commonly used metal for forming devices and interconnects.

Unfortunately, there are a number of manufacturing obstacles attributable to the use of such materials in integrated circuit device fabrication. For example, one common processing technique, chemical mechanical polishing (CMP), is commonly employed in integrated circuit device fabrication for polishing away conductive materials for forming plugs, interconnects and other devices. However, it is not uncommon for certain malleable metals such as silver and silver-based materials to inadvertently pull from the plug during CMP processing. This is particularly problematic when forming devices and interconnects where silver is intended to form a plug coupling to an underlying layer of tungsten. Silver adheres poorly to tungsten, thus the silver pulls easily from the plug. Even in cases where the metal does not completely pull from the via, inconsistent or otherwise unreliable structures such as partially filled vias can result post CMP. This can lead to open circuit connections or high resistance plugs.

Therefore, there is a continuing need for a CMP process in integrated circuit device fabrication that allows consistent and reliable formation of devices and interconnects using malleable metals.

BRIEF SUMMARY OF THE INVENTION

This need is met by the present invention wherein a scheme for filling plugs comprises depositing a malleable conductive layer over a dielectric layer having openings formed therein. The malleable conductive layer is deposited such that a liner is formed within the openings, however the openings are not completely filled. A chemical-mechanical polishing (CMP) process is then performed such that the malleable conductive layer smears, filling the openings and defining filled or substantially filled plugs.

More specifically, a special chemical mechanical polishing (CMP) process is used to fill the remainder of the vias with the malleable conductive layer such that reliable devices and interconnects are formed. For example, when using a silver-based conductive material as the malleable conductive layer, the silver-based conductive material is polished by CMP using an alumina based slurry at a neutral or slightly basic pH and no oxidizer. It is believed that at least a portion of the silver-based conductive material smears sufficiently during the CMP process to fill the remainder of the vias, forming filled or substantially filled plugs. It will be appreciated that the slurry composition will vary depending upon the malleable metal used for the CMP.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

It shall be observed that the process steps and structures described herein do not form a complete process flow for manufacturing integrated circuits. The present invention can be practiced in conjunction with a variety of integrated circuit fabrication techniques currently used in the art. As such, commonly practiced process steps are included in the description herein only if those steps are necessary for an understanding of the present invention.

For the purposes of defining and describing the present invention, it is noted that a malleable conductive layer is any malleable metal alone or in combination with any material, composition, or mixture of materials. The present invention is particularly suitable for filling plugs using silver or a silver-based conductive material including for example pure silver, a silver containing an alloy such as copper or gold, silver coated copper particles, silver-based conductive materials dispersed in an organic medium, etc. Additionally, the present invention is also suitable for filling plugs using other malleable metals such as gold, platinum, and to a lesser degree, copper. However, results will vary depending upon the malleability of the metal or alloy used to fill the plug according to the present invention.

Further, as used herein, the formation of a layer or region "over" a substrate or other layer refers to formation above, or in contact with, a surface of the substrate or layer. For example, where it is noted or recited that an insulating layer is formed over a substrate, it is contemplated that intervening structural layers may optionally be present between the insulating layer and the substrate.

Formation of a Malleable Conductive Layer Device

Figure 1A:
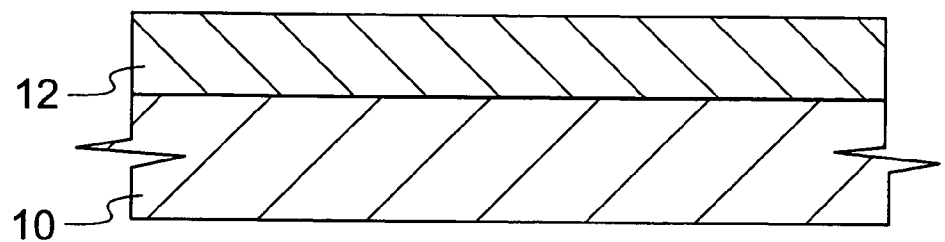
FIGS. 1A–1H depict cross-sectional illustrations of a process of forming a device using a malleable conductive metal according to one embodiment of the present invention.

With reference to FIG. 1A, the structure includes a base layer 10 and a first layer 12 formed over the base layer 10. The base layer 10 is any previously processed substrate. For example, if the structure is a capacitor for use in a memory cell, the base layer 10 may comprise a connection to a source drain region of a transistor. However, the present invention is not limited to such applications. Rather, the present invention is applicable to the formation of any device where it is desirable to fill a plug with a malleable conductive material. As such, the specifics of the base layer 10 are not explicitly illustrated. The first layer 12 comprises an electrode, formed preferably of a material such as tungsten or a tungsten based material. The first layer 12 is deposited using techniques as are known in the art.

Figure 1B:
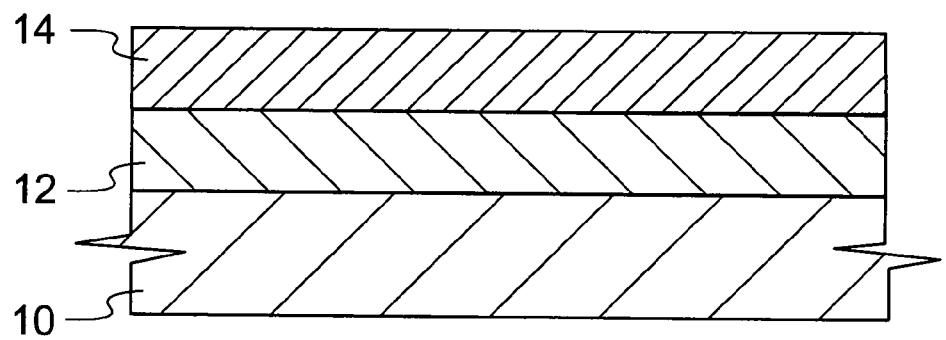

As illustrated in FIG. 1B, a second layer 14 comprises a dielectric material. The second layer 14 is preferably silicone nitride, but may also comprise any dielectric material as is known in the art, for example, silicon dioxide ($SiO_2$) (doped or undoped), phosphosilicate glass (PSG), borophosphosilicate glass (BPSG), silicon oxynitride, a low-k material such as polyamide, any other suitable insulator material. The second layer 14 may also comprise any combination of materials. For example, the second layer 14 may comprise a layer of BPSG deposited over the first layer 12, then a silicon nitride layer deposited over the BPSG. The second layer 14 may be deposited using techniques known in the art. For example, a laser plasma chemical vapor deposition process (LPCVD) may be used to deposit a layer of silicon nitride. Further, it is noted that a silicon nitride material may comprise a pure silicon nitride material or a silicon nitride material including additional components or impurities.

Figure 1C:
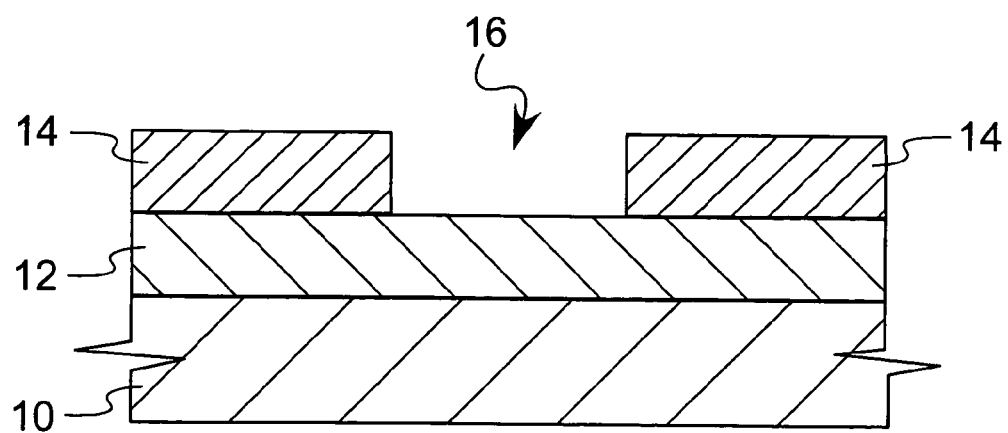

A portion of the second layer 14 is removed completely to define opening or via 16 as illustrated in FIG. 1C. It shall be appreciated that any number of vias 16 may be formed as the specific application dictates. The via 16 extends completely through the second layer 14 and may be formed as a trench, via, hole, plug, or other bore as are known in the art. Further, any technique can be used to form the via 16. For example, a patterned photoresist is formed using high-resolution photolithography, the resist masks out portions of the second layer 14 defining the location where the via 16 is to be formed. An etching process then removes the second layer 14 in the area of the via 16.

Figure 1D:
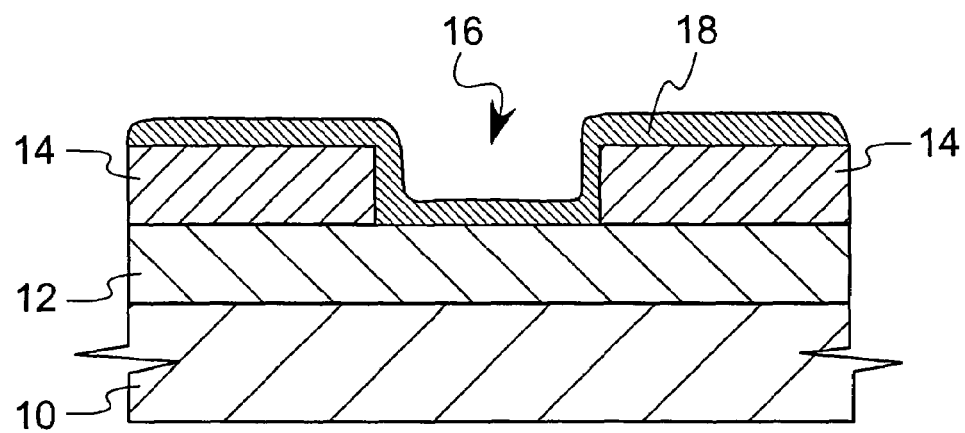

As illustrated in FIG. 1D, a third layer 18 is provided over the second layer 14 and within the via 16 so as to merely line the via 16. The third layer should not fill the via 16 entirely. The third layer 18 comprises a malleable conductive layer. The malleable conductive layer may be deposited using techniques as are known in the art including for example, electroless, evaporation, or sputtering techniques.

Figure 1E:
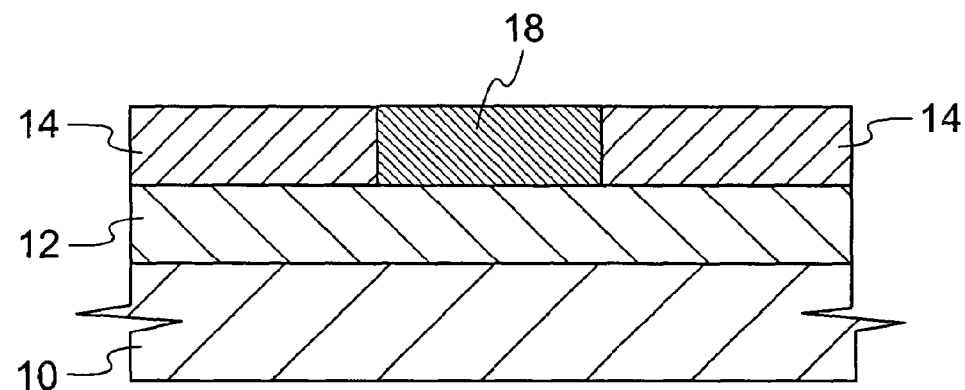

As shown in FIG. 1E, portions of the third layer 18 above the second layer 14 are removed in such a fashion that the via 16 is filled by at least a portion of the third layer 18. The third layer 18 within the via 16 electrically couples to the first layer 12 (tungsten for example).

To accomplish filling the via 16 with the third layer 18, a CMP process is used to smear the third layer 18 such that at least a portion of the third layer 18 that lies over the second layer 14 is smeared or pushed into the via 16 to combine with the portion of the third layer 18 that merely lines the via 16 as illustrated in FIG. 1E.

As used herein, the term "smear" refers to an act or process whereby a partially filled, lined or, previously unfilled via, plug, trench, or like structure is filled or substantially filled subsequent to the act or process. For example, during the CMP process according to one embodiment of the present invention, it is believed that a portion of the malleable conductive layer (third layer 18 as shown) on the surface of the second layer 14 spreads, daubs, squeezes, or is otherwise moved or pushed into the via 16 to plug or fill the opening. It is believed that it is the malleability of the third layer 18 that allows the smearing to effectively fill the plug. The CMP process, including the composition of suitable slurries used to facilitate the smearing process are described more thoroughly herein.

Programmable Conductor RAM (PCRAM) Devices

Figure 1F:
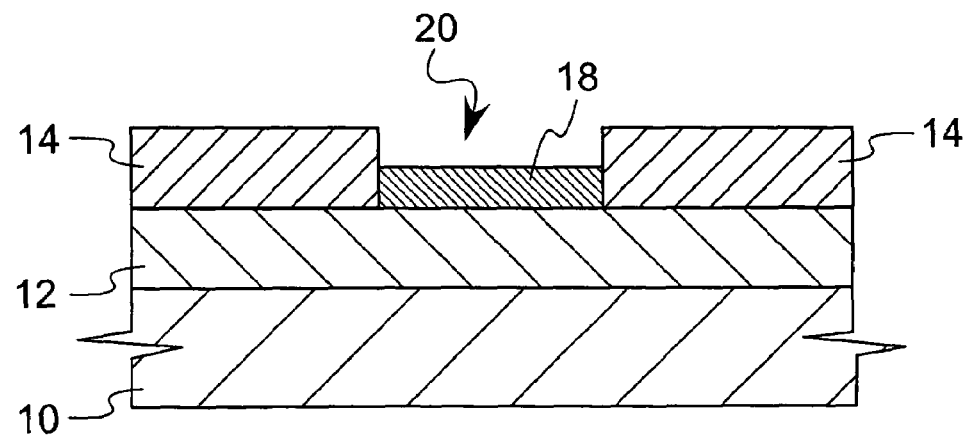
Figure 1G:
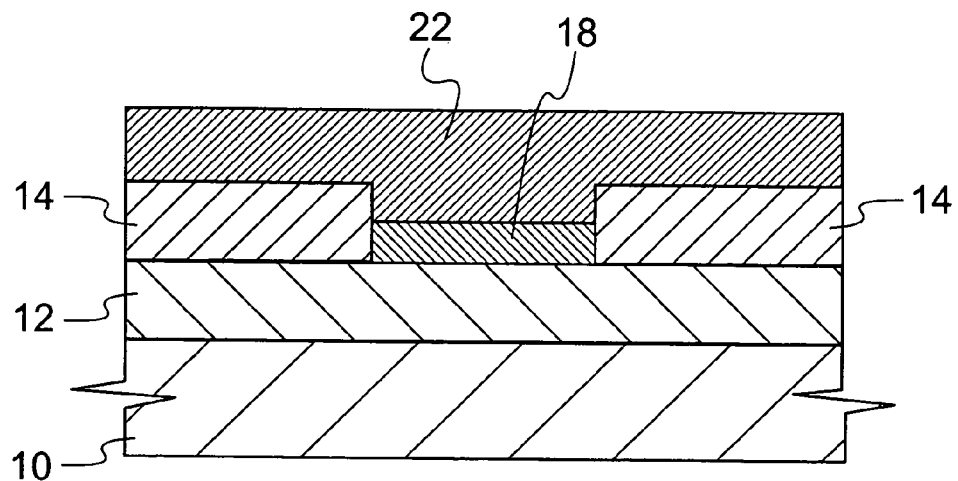
Figure 1H:
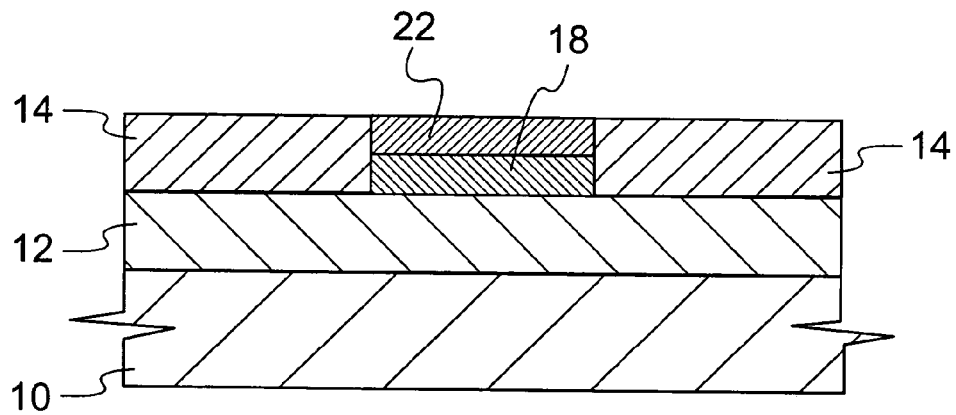
Figure 1I:
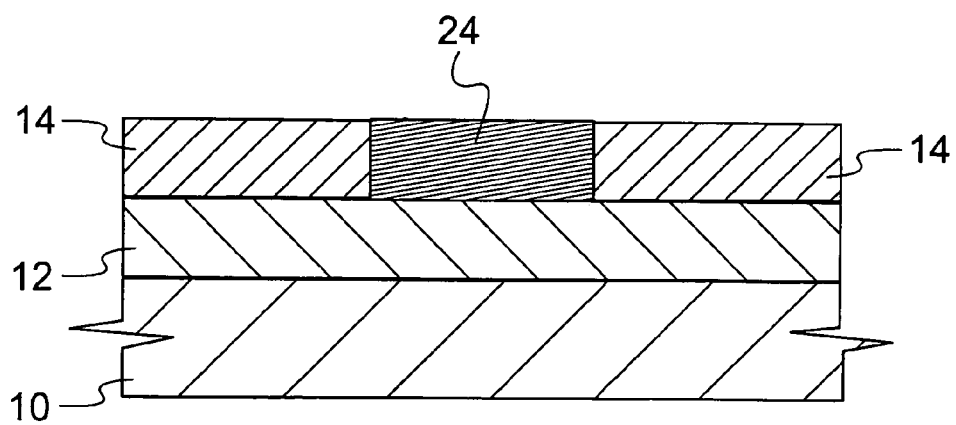

A PC RAM cell is a programmable conductor based upon a Germanium Selenide glass, chalcogenide, into which relatively high levels of Silver is dissolved. One flow suitable to form this cell is described with reference to FIGS. 1A–1I. A structure is formed as described above with reference to FIGS. 1A–1E, using a silver-based conductive material as the malleable conductive layer, or third layer 18. Referring to FIG. 1F, a portion of the third layer 18 is etched back forming a space 20. For example, the third layer 18 is etched back approximately half way within the opening. A fourth layer 22 is deposited over the third layer 18, and optionally over the second layer 14 as illustrated in FIG. 1G. The fourth layer 22 comprises a chalcogenide, such as a combination of selenium and germanium. For example, $Ge_3Se_7$ is deposited using techniques such as evaporation, sputtering, or other processes well known in the art. Portions of the fourth layer 22 are removed such that the only portion of the fourth layer 22 remaining fills the space 20 above the third layer 18 as illustrated in FIG. 1H. The device is then suitably heated, or exposed to ultra violet (UV) radiation such that the third layer 18 dissolves into the chalcogenide, or fourth layer 22 to form a solid solution 24 as illustrated in FIG. 1I.

As illustrated herein, the Programmable Conductor Cell is constructed by depositing a silver-based conductive material in a via such that the via is lined. The via is then smeared such that the via is filled with the silver-based conductive material. The silver-based conductive material is etched back such that the via is approximately half full. The Chalcogenide is then deposited, the structure is polished, then exposed to heat or light to form the solution.

It will be observed that the above device is merely demonstrative of the type of device that may be formed according to the present invention. The present invention, lining a via with a malleable conductive layer, then filling the via by smearing using a CMP technique, can be used to build any number of devices.

Formation of a Malleable Conductive Layer Interconnect

For the purposes of defining and describing this embodiment of the present invention, it is noted that an interconnect comprises any type of conductive line connecting devices, bond pads, or other elements to each other, within an integrated circuit structure, device, or assembly. Interconnects are also commonly referred to as plugs, contacts, vias, etc.

Moreover, one of the exemplary embodiments described herein illustrate the present invention as applied to the formation of interconnects at specific levels of integrated circuit fabrication. However, the processing techniques of the present invention may also be applied to formation of interconnects at various levels of metallization within an integrated circuit fabrication process.

Figure 2A:
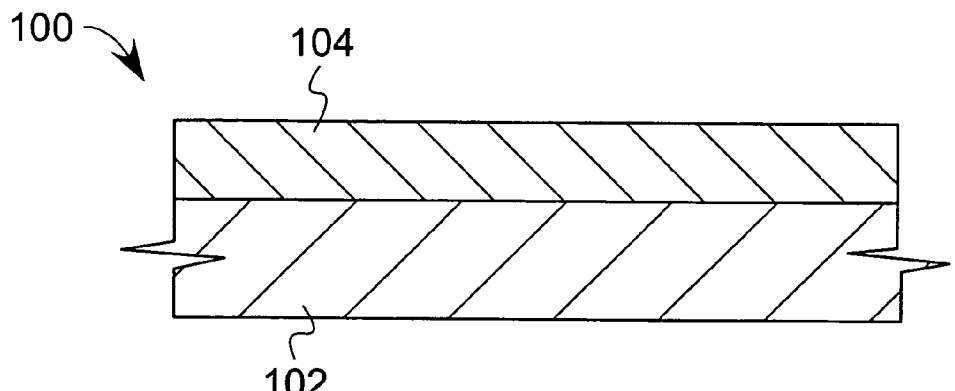
FIGS. 2A–2H depict cross-sectional illustrations of a process of forming interconnects according to one embodiment of the present invention; and, FIG. 3 is a schematic illustration of a chemical mechanical polishing apparatus.

With reference to FIG. 2A, the structure 100 includes a base layer 102 and a first layer 104 over the base layer 102. The base layer 102 is any layer in which it is desirable to form an interconnect structure thereover. For example, the base layer 102 may comprise a silicon wafer or other substrate such as gallium arsenide, aluminum oxide, glass, ceramic, or other similar substrate material. The base layer 102 may also comprises an interconnect structure having conductive paths. It shall be understood that the base layer 102 may be any previously processed substrate.

The first layer 104 comprises a dielectric material and serves as a first etch stop layer. For example, the first layer 104 is preferably silicone nitride, but may also comprise silicon dioxide (SiO$_2$) (doped or undoped), phosphosilicate glass (PSG), borophosphosilicate glass (BSPG), silicon oxynitride, a low-k material such as polyamide, any other suitable insulator material. Further, it is noted that a silicon nitride material may comprise a pure silicon nitride material or a silicon nitride material including additional components or impurities. The first layer 104 may also comprise any combination of materials. For example, the first layer 104 may comprise a layer of BPSG deposited over the base layer 102, then a silicon nitride layer deposited over the BPSG to define the etch stop layer. The first layer 104 may be deposited using techniques known in the art. For example, a laser plasma chemical vapor deposition process (LPCVD) may be used to deposit a layer of silicon nitride as is known in the art.

Figure 2B:
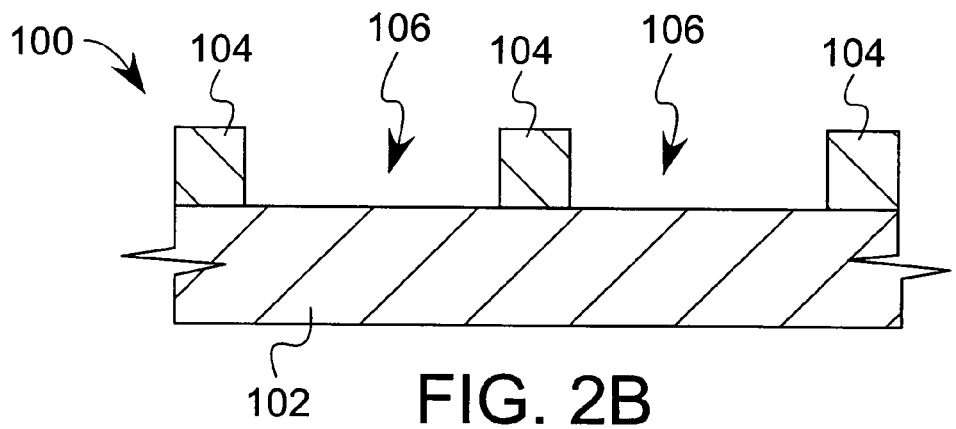

As shown in FIG. 2B, portions of the first layer 104 are removed completely to define openings 106 that expose contact regions within the base layer 102. The openings 106 extend completely through the first layer 104 and may be formed as trenches, vias, holes, plugs, or other bores as are known in the art. Any technique can be used to form the openings 106 in the first layer 104. For example, a patterned photoresist is formed using high-resolution photolithography, the resist masks out portions of the first layer 104 defining the locations of where the openings 106 are to be formed. An etching process then removes the first layer 104 in the area of the openings 106.

Figure 2C:
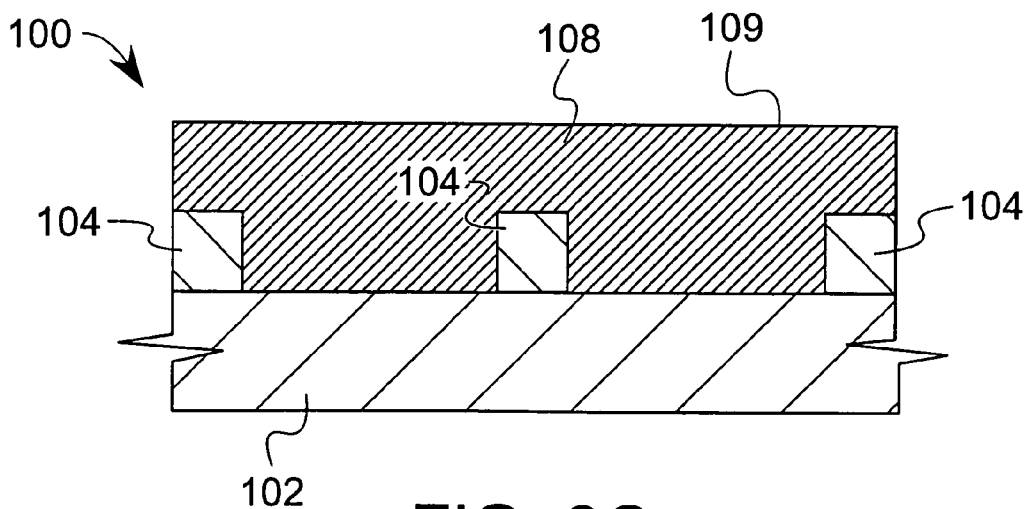

Referring to FIG. 2C, a second layer 108 is deposited over the first layer 104. The second layer is a conformal metal layer arranged such that the openings 106 as shown in FIG. 2B are filled by the second layer 108. The second layer 108 is any metal as known in the art, and can include for example, tungsten, aluminum, aluminum alloy, titanium, titanium nitride, gold, copper, copper alloys, molybdenum, silver, polycrystalline silico (polysilicon) or a variety of other conductive metals individually or in combination. Known filling operations are usually accomplished by depositing the second layer 108 onto the exposed surface of the first layer 104 sufficiently thick enough to fill those portions of the first layer 104 which have been left unoccupied by previous deposition and/or etching operations or masked deposition operations. Depending upon the composition of the first and second layers 104, 108, optional barrier layers or adhesion layers (not shown) as are known in the art may be used so that the second layer 108 adheres to the first layer 104 and the base layer 102. Any method known in the art may be used to form the second layer. For example, common techniques include Physical Vapor deposition (PVD), or anisotropic etching of CVD-deposited tungsten and titanium nitride layers.

Figure 2D:
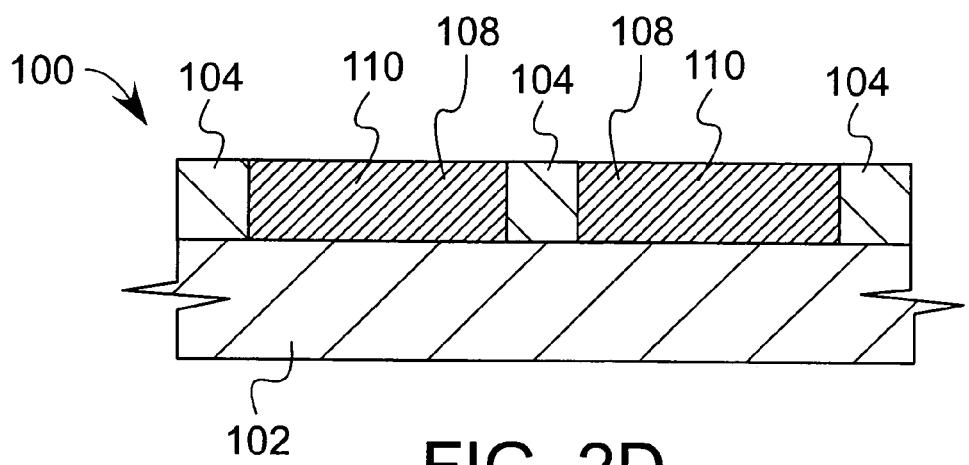

Referring to FIG. 2D, portions of the second layer 108 above the first layer 104 are removed such as by CMP or other polishing techniques defining first contact regions 110 within the first layer 104. It shall be observed that the first contact regions 110 electrically couple the second layer 108 in the first contact region 110 to devices within the base layer 102. For example, the first contact regions 110 may couple to a source/drain region or gate of a transistor, to a plate of a capacitor, or to another interconnect structure on the base layer 102 (not shown in FIGS. 2A–2H).

Figure 2E:
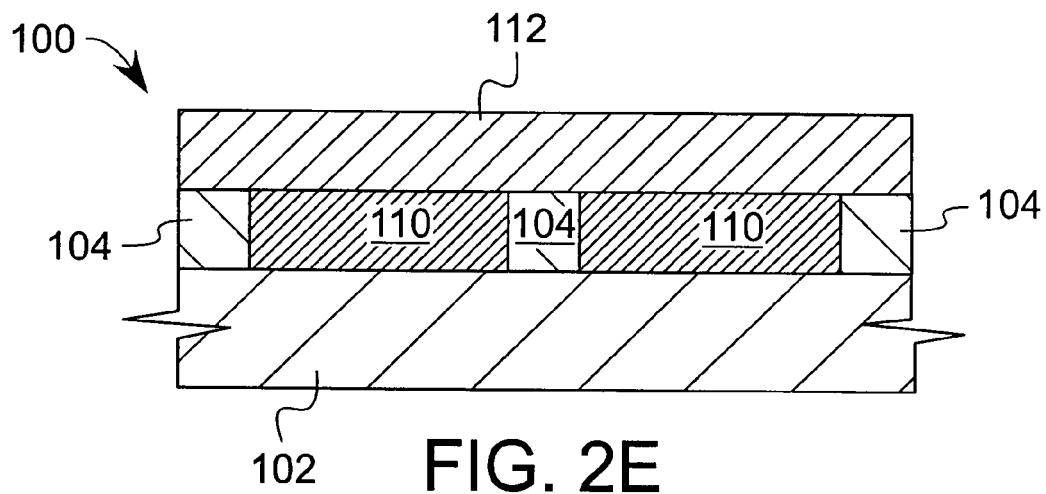

As illustrated in FIG. 2E, a third layer 112 is formed over the first layer 104 and first contact regions 110. The third layer 112 can be comprised of any suitable dielectric material such as those described with reference to the first layer 104, but preferably comprises silicon nitride.

Figure 2F:
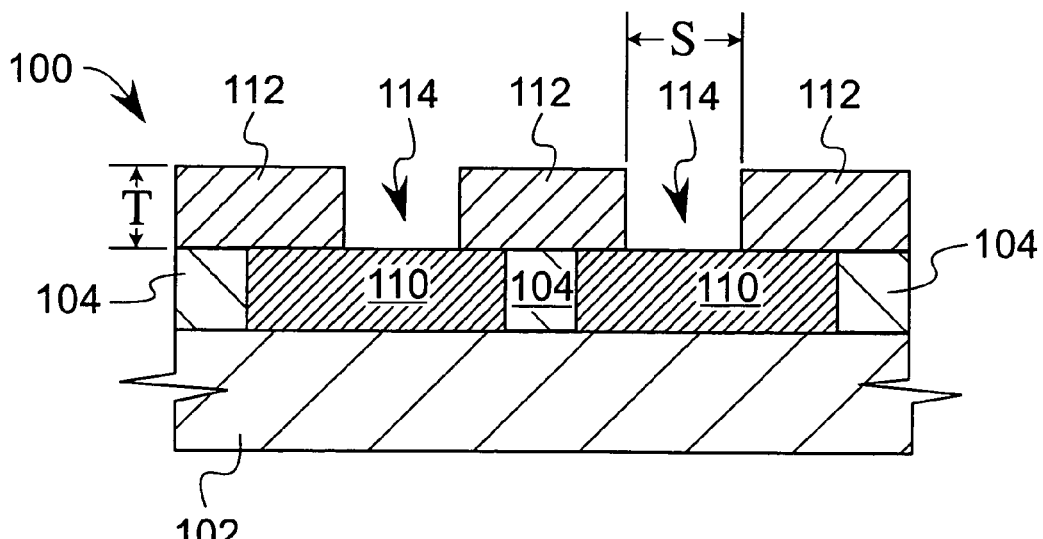

As shown in FIG. 2F, vias 114 are formed in the third layer 112 such that the vias 114 are substantially aligned over the first contact regions 110, exposing portions of the first contact regions 110. According to one embodiment of the present invention, it is preferable to construct relatively deep vias 114 within the third layer 112. For example, according to one embodiment of the present invention, a suitable third layer 112 comprises a layer of silicon nitride having a thickness T of at least approximately 1000 Å. More preferably, the third layer 112 should have a thickness T between approximately 1500 Å and 2000 Å. Further, according to one embodiment of the present invention, the size S of the via 114 is preferably greater than approximately 0.25 microns and more preferably approximately 0.5 microns. The vias 114 are created using techniques known in the art. For example, it may be preferable to etch the vias to form a shape that is wider at the top than at any other vertical location. For example, the vias 114 may comprise truncated V or U shaped geometries (not shown). Any process for forming vias 114 may be used as is known in the art.

Figure 2G:
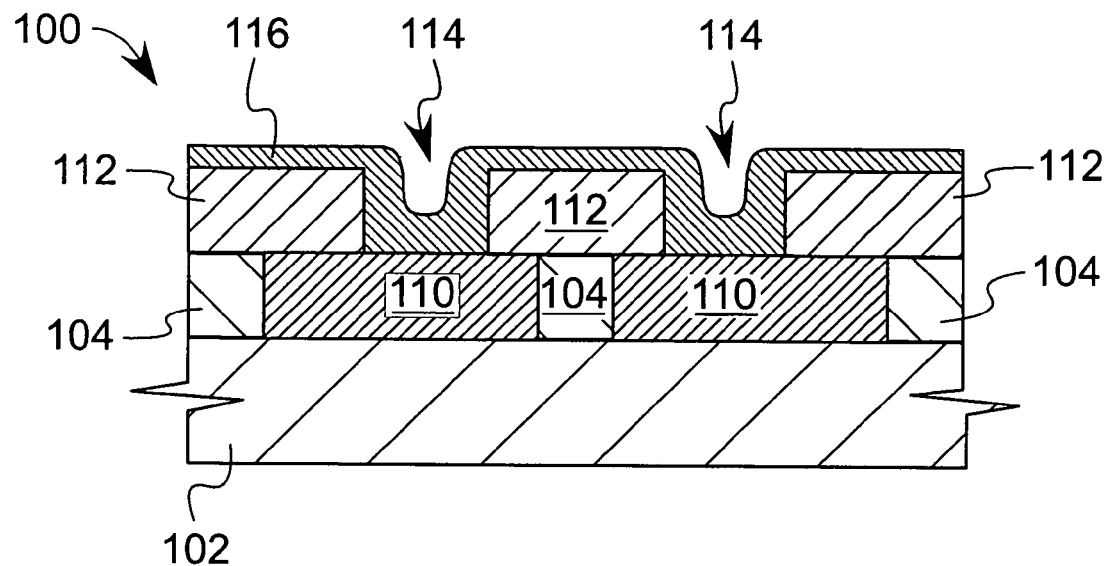

Referring to FIG. 2G, a fourth layer 116 is provided over the third layer 112 and within the vias 114 so as to merely line the vias 114. The fourth layer 116 should not fill the vias 114 entirely. The fourth layer 116 comprises a malleable conductive layer. The malleable conductive layer may be deposited using techniques as are known in the art including for example, electroless, evaporation, or sputtering techniques.

Figure 2H:
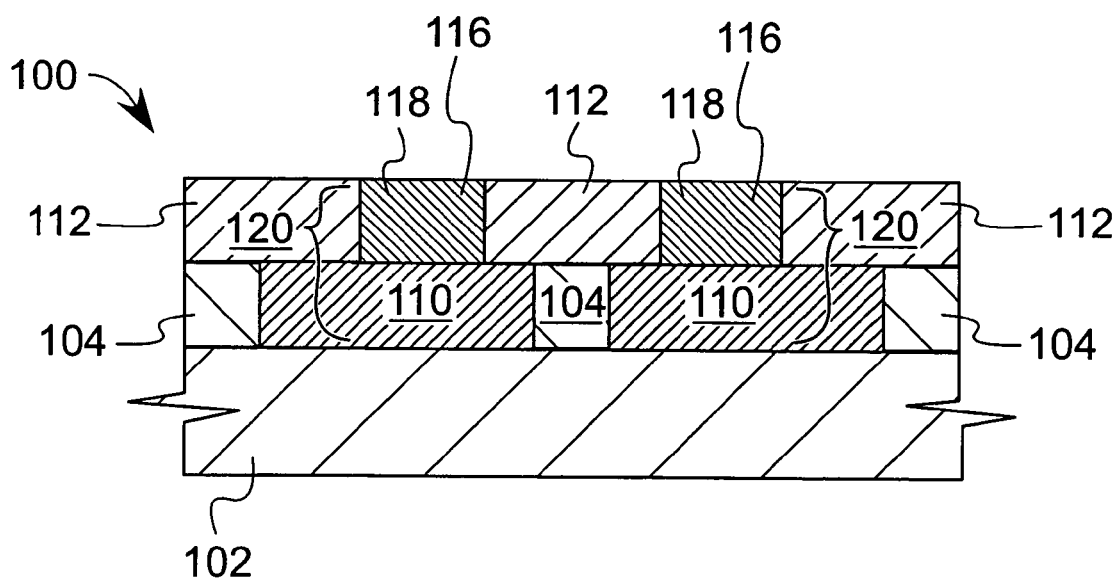

As shown in FIG. 2H, portions of the fourth layer 116 above the third layer 112 are removed in such a fashion that the vias 114 are filled by the fourth layer 116 defining second contact regions 118 as shown in FIG. 2H. The first contact regions 110 electrically couple to respective second contact regions 118 defining interconnects 120. To accomplish forming the second contact regions 118, a CMP process may be used to smear the fourth layer 116 such that at least a portion of the fourth layer 116 that overlies the third layer 112 smears or pushes into the vias 114 to fill or substantially fill the remainder of the vias 114 not already filled by the portion of the fourth layer 116 that already lines the vias 114.

Chemical Mechanical Polishing

Figure 3:
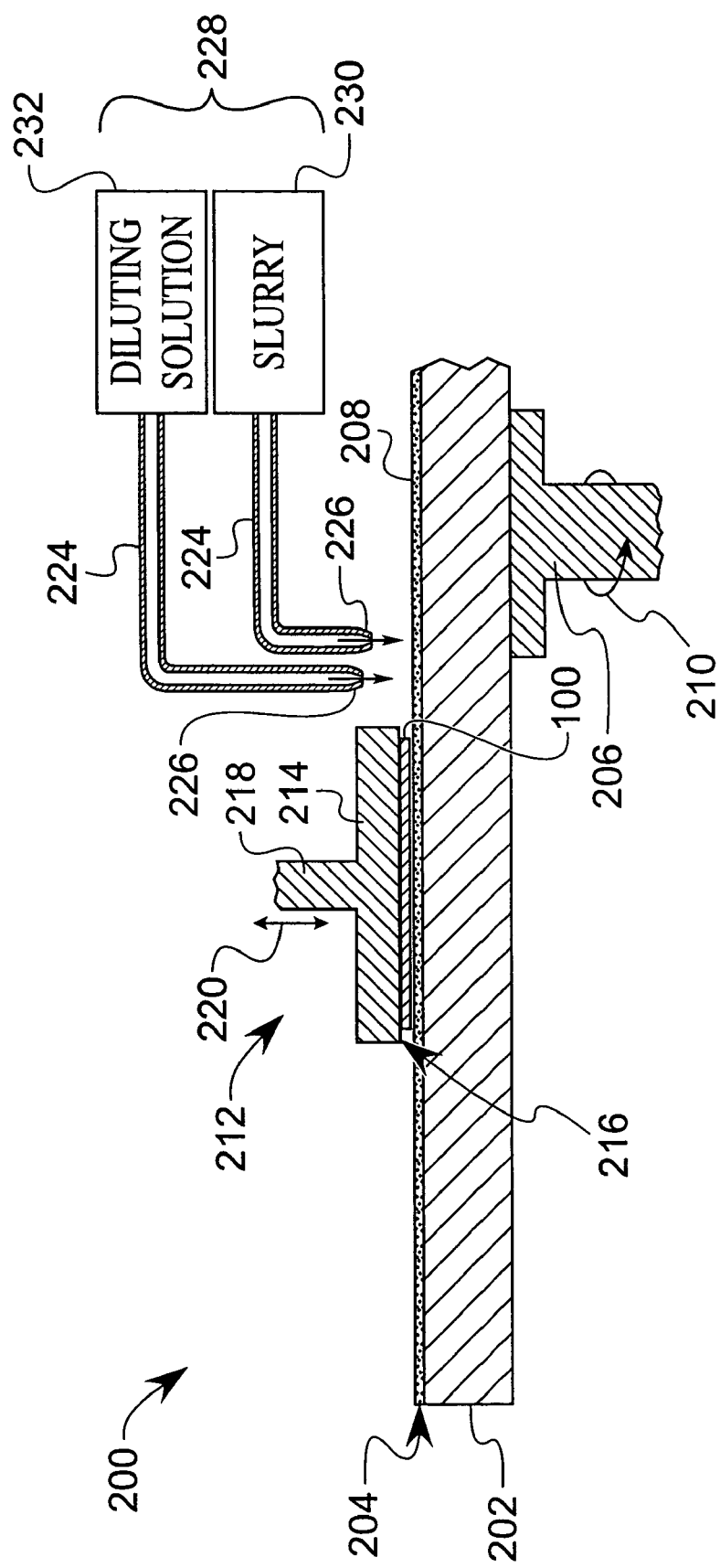

A CMP apparatus 200 is schematically illustrated in FIG. 3. A polishing table 202 having an upper surface 204 is coupled to a table shaft 206. A polishing pad 208 is held to the upper surface 204 of the polishing table 202. Rotation of the table shaft, for example in the direction of the directional arrow 210, thus rotates the polishing pad 208 via the polishing table 202. A wafer carrier 212 includes a polishing head 214 having a lower surface 216, and a shaft 218 coupled to the polishing head 214. The lower surface 216 of the polishing head 214 is adapted for seating a substrate, such as the structures discussed herein with reference to FIGS. 1A–1I and 2A–2H. For example, the structure 100 as discussed with reference to FIGS. 2A–2H is positioned in face-to-face relationship with the polishing pad 208. The shaft 218 of wafer carrier 212 can be rotated or moved using known means. For example, the wafer carrier 212 may be moved vertically in according to directional arrow 220. By moving the wafer carrier 212 downward according to directional arrow 220, a downward force may be applied to the wafer carrier 212 such that the structure 100 is pressed against the polishing pad 208.

During the CMP process, fluids provide an adhesive force between the structure 100 and polishing head 214 of the wafer carrier 212 such that the structure 100 is adhered to the polishing head 214 by way of surface-tension effects therebetween. Solution delivery tubes or pipes 224 have an ejection outlet, or nozzle 226, positioned over the polishing pad 208 to deliver various solutions to the polishing pad 208. It shall be appreciated that while shown with two solution delivery pipes 224 in FIG. 3, one or more solution delivery pipes 224 may actually be required depending upon the composition of the slurry and other job requirements. As shown in FIG. 3, a slurry mixture 228 comprising a slurry 230 and a diluting solution 232 are delivered to the polishing pad 208.

During the CMP process, a surface of the structure being polished is held against the polishing pad 208 while chemical mechanical polishing (CMP) slurry mixtures 228 are dispensed and applied to the polishing pad 208. During the polishing procedure, the rotational movement of polishing pad 208 will cause the slurry mixture 228 to flow radially outward. Some of the slurry mixture 228 will flow off polishing pad 208 due to the centrifugal forces of the rotation. Accordingly, in order to keep an adequate amount of slurry mixture 228 on the polishing pad 208 during polishing, the slurry mixture 228 is typically supplied to polishing pad 208 continually during the CMP process. The flow rate of the slurry mixture 228 will vary depending upon the slurry used and various rotation speeds of the polishing table 202 and the polishing head 214. For example, according to one embodiment of the present invention, the rotational speed of the polishing table 202 is approximately between 30 and 50 revolutions per minute (rpm) and the rotational speed of the polishing head 214 is approximately between 25 and 50 rpm.

As used herein, diluting solution 232 refers to diluents used to wash away material from the polishing pad 208. For example, the diluting solution 232 may comprise a liquid applied to the polishing pad 208 arranged to clean the polishing pad 208. Alternatively, the diluting solution 232 may comprise a buffer solution, or alternatively, simply a solvent. A buffer solution refers to a known solution comprising both a weak acid and weak base and having the ability to absorb small additions of acids and bases without giving rise to a significant change in the pH of the solution. A known solvent generally refers to a liquid capable of dissolving or dispersing other substances; typically the substance of greatest proportion in a solution is deemed the solvent. However, in solutions that contain water, water is typically deemed the solvent.

CMP techniques for malleable metals such as silver are well known in the art. CMP of silver can be done with practically all types of slurries available including alumina with hydrogen peroxide or potassium iodate, and silica with ammonia or TMAH. However, when polishing silver using conventional CMP techniques, the silver tends to pull away from vias due to poor adherence of the silver with the underlying contact region. For example, with reference to the structures discussed herein, a silver, or a silver-based conductive material may be used to fill a via and form an electrical contact with tungsten. However, poor adherence of silver to tungsten is well known.

It is believed that the malleable conductive layer, such as silver, smears into the vias during the CMP process thus filling the vias as shown in FIGS. 1D–1E and 2G–2H. If the malleable conductive layer fills the vias prior to CMP, a higher stress is exhibited at the center of the plug. This tends to pull the malleable conductive layer out of the via. This phenomenon is worsened where the malleable conductive layer exhibits poor adhesion with the underlying contact region. Such as when filling silver vias formed over an underlying contact region of tungsten. However, selecting a slurry mixture 228 according to the present invention allows the MP process to cause smearing, which results in more of the malleable conductive layer in the plug or via after CMP than post sputter.

The preferred slurry 230 for a silver-based conductive material comprises an alumina abrasive at a neutral or slightly basic pH with no oxidizer. For example, a suitable alumina abrasive has a 100 nanometer (nm) particle size. While the pH may vary depending upon other parameters of the slurry 230, a preferable range comprises a pH between approximately 6 and 9. That is, the pH may be slightly acidic to slightly basic. However, a neutral to slightly basic pH, approximately between 7 and 8 for example, is even more preferable.

The CMP process should be carried out at a low down force to ensure intact plugs. For example, according to one embodiment of the present invention, when using a CMP apparatus such as that schematically illustrated in FIG. 3, the force applied to the wafer carrier 212 in the downward direction according to directional arrow 220 may be less than two foot pounds. More preferably, the down force may be applied between approximately 0.5 foot pounds to 1.5 foot pounds.

It should be observed that changes to the above-described slurry 230 may have profound results and yield unsatisfactory devices and interconnects. For example, the addition of hydrogen peroxide slows the removal rate and tends to pull the plugs. Further, the use of colloidal silica with ammonia may result in empty plugs being formed.

With respect to the above-described slurry 230, a slurry mixture 228 comprising one part slurry to approximately 10 parts of diluting solution 232 is preferable, however, the exact slurry mixture 228 may vary depending upon the slurry 230 and the diluting solution 232 used.

Finally, the slurry should be highly selective to the dielectric layer underlying the malleable conductive layer being smeared by the CMP process. For example, where a silver-based conductive material fills a via in a silicon nitride dielectric layer, the slurry should be highly selective to silicon nitride, meaning that more material per unit time is removed of the silver-based conductive material than the silicon nitride. For example, alumina is a preferable component of the slurry 230 because alumina does not attack silicon nitride in an aggressive manner.

While the present invention may be practiced with any number of malleable metals, silver is a preferable metal due to certain electrical properties. For example, when properly doped with a chalcogenide in a via, current threshold switching may be realized. This is a useful structure for example, in constructing PC RAM cells. Also, silver is more thermally stable than other commonly used metals, thus making silver more resistant to oxidation. Additionally, electromigration is believed to be less of a problem with silver than with many other metals. Further, certain malleable metals that can be used with the present invention including silver, have lower resistivity than aluminum, which is currently the most common metal used to form interconnects. Aluminum has a resistivity of about 2.7 $\mu\Omega$-cm. By utilizing lower resistivity metals such as silver (approximately 1.2–1.5 $\mu\Omega$-cm), copper (approximately 1.7–1.8 $\mu\Omega$-cm), or gold (approximately 2.3–2.4 $\mu\Omega$-cm), devices with smaller cross-sectional areas can be formed without increasing the total resistance of the device over a comparable aluminum device. This allows more dense integrated devices and interconnects.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of filling an opening, wherein said opening extends from an upper surface of a dielectric layer through said dielectric layer to an underlying conductive layer supported by a substrate, said method comprising:

forming a malleable conductive layer over said upper surface of said dielectric layer such that a thickness of said malleable conductive layer is substantially less than a thickness of said dielectric layer and an unfilled void extends upwardly from within said opening; and moving a portion of said malleable conductive layer formed over said upper surface of said dielectric layer into said unfilled void by polishing said malleable layer so as to plug said opening.

2. A method according to claim 1 wherein:

said malleable conductive layer is further formed within said opening such that it lines said opening;

an uppermost surface of said malleable conductive layer defines said unfilled void extending upwardly from an uppermost surface of said malleable conductive layer within said opening.

3. A method of filling an opening, wherein said opening extends from an upper surface of a dielectric layer through said dielectric layer to an underlying conductive layer supported by a substrate, said method comprising:

forming a malleable conductive layer over said upper surface of said dielectric layer and within said opening wherein a thickness of said malleable conductive layer is substantially less than a thickness of said dielectric layer such that said malleable conductive layer lines said opening and an uppermost surface of said malleable conductive layer defines an unfilled void extending upwardly from said uppermost surface of said malleable conductive layer within said opening; and moving a portion of said malleable conductive layer formed over said upper surface of said dielectric layer into said unfilled void by polishing said malleable layer so as to plug said opening.

4. A method according to claim 3, wherein said malleable conductive layer is smeared by performing a chemical mechanical polishing operation such that said malleable conductive layer plugs said opening.

5. A method according to claim 4, wherein said chemical mechanical polishing operation is performed with a slurry free from an oxidizer.

6. A method according to claim 4, wherein said chemical mechanical polishing operation is performed with a slurry free from hydrogen peroxide.

7. A method according to claim 4, wherein said chemical mechanical polishing operation is performed with a slurry comprising an alumina abrasive.

8. A method according to claim 4, wherein said chemical mechanical polishing operation is performed with a slurry at generally a neutral to slightly basic pH.

9. A method according to claim 4, wherein said chemical mechanical polishing operation is performed with a slurry comprised of an alumina abrasive at neutral to slightly basic pH, and free of an oxidizer.

10. A method according to claim 9, wherein said chemical mechanical polishing operation is performed with a slurry mixture comprised of said slurry and a diluting solution mixed at a ratio of ten parts of said diluting solution to one part of said slurry.

11. A method according to claim 4, wherein said chemical mechanical polishing operation is performed with a slurry comprised of an alumina abrasive at neutral to slightly basic pH, and free of an oxidizer.

12. A method according to claim 3, wherein said dielectric layer is formed to be at least 1000 angstroms thick.

13. A method according to claim 3, wherein said opening is formed having a diameter of at least 0.25 microns.

14. A method of filling a plug according to claim 3, wherein said malleable conductive layer is smeared so as to increase the amount of said malleable conductive layer in said opening.

15. A method according to claim 3, wherein said malleable conductive layer is deposited by forming a liner of malleable conductive material in said opening.

16. A method according to claim 3, wherein said malleable conductive layer comprises a silver-based conductive material.

* * * * *